US011102892B2

(12) United States Patent
Boday et al.

(10) Patent No.: US 11,102,892 B2
(45) Date of Patent: Aug. 24, 2021

(54) COATING METAL FOIL WITH N-HETEROCYCLIC CARBENE COMPOUNDS CONTAINING ORGANIC FUNCTIONALITIES FOR IMPROVING METAL-TO-RESIN ADHESION

(71) Applicant: International Business Machines Corporation, Armonk, NY (US)

(72) Inventors: Dylan J. Boday, Tucson, AZ (US); Joseph Kuczynski, North Port, FL (US); Jason T. Wertz, Pleasant Valley, NY (US); Jing Zhang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 16/656,691

(22) Filed: Oct. 18, 2019

(65) Prior Publication Data

US 2020/0053886 A1 Feb. 13, 2020

Related U.S. Application Data

(62) Division of application No. 14/557,818, filed on Dec. 2, 2014, now Pat. No. 10,506,723.

(51) Int. Cl.
*B01J 31/22* (2006.01)
*B32B 5/02* (2006.01)
(Continued)

(52) U.S. Cl.
CPC ........ *H05K 3/4655* (2013.01); *B01J 31/2265* (2013.01); *B01J 31/2269* (2013.01);
(Continued)

(58) Field of Classification Search
CPC .......... B01J 31/2265–2278; B32B 7/12; B32B 15/20; B32B 2255/06; B32B 2255/24; B32B 5/024
See application file for complete search history.

(56) References Cited

U.S. PATENT DOCUMENTS 5,071,701 A 12/1991 Tenney et al.
6,224,965 B1 * 5/2001 Haas .................... H05K 1/0373
428/209
(Continued)

FOREIGN PATENT DOCUMENTS

WO 2014160471 A2 10/2014

OTHER PUBLICATIONS

Dietz, "Fine Lines in High Yield (Part CXLVIII): Adhesion to Copper—Trends and Issues", CircuiTree, Jan. 2008, vol. 21, Issue 1, 4 pages.
(Continued)

*Primary Examiner* — Laura C Powers
*Assistant Examiner* — Larissa Rowe Emrich
(74) *Attorney, Agent, or Firm* — Matthew J. Bussan (57) ABSTRACT

A carbene-coated metal foil is produced by applying an N-heterocyclic carbene (NHC) compound to one or more surfaces of a metal foil (e.g., an electrodeposited copper foil having a surface that is smooth and non-oxidized). The NHC compound contains a matrix-reactive pendant group that includes at least one of a vinyl-, allyl-, acrylic-, methacrylic-, styrenic-, amine-, amide- and epoxy-containing moiety capable of reacting with a base polymer (e.g., a vinyl-containing resin such as a polyphenylene oxide/triallyl-isocyanurate (PPO/TAIC) composition). The NHC compound may be synthesized by, for example, reacting a halogenated imidazolium salt (e.g., 1,3-bis(4-bromo-2,6-dimethylphenyl)-4,5-dihydro-1H-imidazol-3-ium chloride)
(Continued)

and an organostannane having a vinyl-containing moiety (e.g., tributyl(vinyl)stannane) in the presence of a palladium catalyst. In some embodiments, an enhanced substrate for a printed circuit board (PCB) is produced by laminating the carbene-coated metal foil to a substrate that includes glass fiber impregnated with the base polymer.

13 Claims, 2 Drawing Sheets (51) Int. Cl.
| | | |
|---|---|---|
| B32B 7/12 | (2006.01) | |
| B32B 15/20 | (2006.01) | |
| B32B 15/14 | (2006.01) | |
| H05K 3/46 | (2006.01) | |
| H05K 3/38 | (2006.01) | |
| H05K 1/03 | (2006.01) | |
| B32B 15/08 | (2006.01) | |
| H05K 3/02 | (2006.01) | |
| C08L 1/00 | (2006.01) | |

(52) U.S. Cl.
CPC .......... *B01J 31/2278* (2013.01); *B32B 5/024* (2013.01); *B32B 7/12* (2013.01); *B32B 15/14* (2013.01); *B32B 15/20* (2013.01); *H05K 3/389* (2013.01); *B32B 15/08* (2013.01); *B32B 2255/06* (2013.01); *B32B 2255/24* (2013.01); *B32B 2255/26* (2013.01); *B32B 2260/021* (2013.01); *B32B 2260/046* (2013.01); *B32B 2262/101* (2013.01); *B32B 2307/202* (2013.01); *B32B 2307/538* (2013.01); *B32B 2307/546* (2013.01); *B32B 2457/08* (2013.01); *C08L 1/00* (2013.01); *H05K 1/0366* (2013.01); *H05K 3/022* (2013.01); *H05K 2203/0392* (2013.01); *H05K 2203/061* (2013.01); *H05K 2203/122* (2013.01)

(56) References Cited

U.S. PATENT DOCUMENTS

| | | | |
|---|---|---|---|
| 6,274,224 | B1 | 8/2001 | O'Bryan et al. |
| 6,736,988 | B1 | 5/2004 | Gaku et al. |
| RE39,615 | E | 5/2007 | Poutasse |
| 9,974,193 | B2 | 5/2018 | Boday et al. |
| 2004/0192664 | A1 | 9/2004 | Kunz et al. |
| 2009/0069569 | A1 | 3/2009 | Nolan et al. |
| 2010/0323099 | A1 | 12/2010 | Sparing et al. |
| 2010/0324247 | A1 | 12/2010 | Kojima et al. |
| 2014/0275555 | A1* | 9/2014 | Johnson .............. C07D 233/06 548/255 |
| 2016/0157361 | A1 | 6/2016 | Boday et al. |
| 2016/0157362 | A1 | 6/2016 | Boday et al. |
| 2018/0168051 | A1 | 6/2018 | Boday et al. |

OTHER PUBLICATIONS

Doyle, "Catalytic Methods for Metal Carbene Transformations", Chemical Reviews, 1986, vol. 86, No. 5, pp. 919-939.

Zhukhovitskiy et al., "Addressable Carbene Anchors for Gold Surfaces", Journal of the American Chemical Society, 2013, vol. 135, Issue 20, pp. 7418-7421.

Zhukhovitskiy et al., "Supporting Information for: Addressable carbene anchors for gold surfaces", downloaded from <http://pubs.acs.org/doi/suppl/10.1021/ja401965d/suppl_file/ja401965d_si_001.pdf> on Oct. 8, 2014, pp. S1-S21.

Kuhn et al., "A Facile Preparation of Imidazolinium Chlorides", Organic Letters, 2008, vol. 10, No. 10, pp. 2075-2077, Author Manuscript downloaded from <http://www.ncbi.nlm.nih.gov/pmc/articles/PMC2666923/pdf/nihms97659.pdf> on Nov. 10, 2014, pp. 1-9.

Kuhn et al., "A Facile Preparation of Imidazolinium Chlorides: Supporting Information", downloaded from <http://pubs.acs.org/doi/suppl/10.1021/ol800628a/suppl_file/ol800628a-file003.pdf> on Nov. 10, 2014, pp. 1-8.

"Copper Foils for High Frequency Materials", Rogers Corporation, downloaded from <http://www.rogerscorp.com/documents/749/acm/Copper-Foils-for-High-Frequency-Circuit-Materials.pdf> on Nov. 14, 2014, pp. 1-8.

"Palladium-Catalysed Coupling Chemistry", Thermo Fisher Scientific Inc., downloaded from <http://www.acros.com/mybrochure/aowhpapdbrochuslow.pdf> on Nov. 13, 2014, pp. 1-16.

List of IBM Patents or Patent Applications Treated as Related (Dated Oct. 18, 2019).

U.S. Appl. No. 14/557,818, to Boday et al., entitled "Coating Metal Foil With N-Heterocyclic Carbene Compounds Containing Organic Functionalitites for Improving Metal-to-Resin Adhesion", filed Dec. 2, 2014, assigned to International Business Machines Corporation.

U.S. Appl. No. 14/871,991, to Boday et al., entitled "Coating Metal Foil With N-Heterocyclic Carbene Compounds Containing Organic Functionalitites for Improving Metal-to-Resin Adhesion", filed Sep. 30, 2015, assigned to International Business Machines Corporation.

U.S. Appl. No. 15/882,387, to Boday et al., entitled "Coating Metal Foil With N-Heterocyclic Carbene Compounds Containing Organic Functionalitites for Improving Metal-to-Resin Adhesion", filed Jan. 29, 2018, assigned to International Business Machines Corporation.

* cited by examiner

COATING METAL FOIL WITH N-HETEROCYCLIC CARBENE COMPOUNDS CONTAINING ORGANIC FUNCTIONALITIES FOR IMPROVING METAL-TO-RESIN ADHESION

BACKGROUND

The present invention relates in general to improving metal-to-resin adhesion in printed circuit boards. More particularly, the present invention relates to coating metal foil with N-heterocyclic carbene (NHC) compounds containing matrix-reactive pendant groups capable of reacting with a base polymer.

SUMMARY

In accordance with some embodiments of the present invention, a carbene-coated metal foil is produced by applying an N-heterocyclic carbene (NHC) compound to one or more surfaces of a metal foil (e.g., an electrodeposited copper foil having a surface that is smooth and non-oxidized). The NHC compound contains a matrix-reactive pendant group that includes at least one of a vinyl-, allyl-, acrylic-, methacrylic-, styrenic-, amine-, amide- and epoxy-containing moiety capable of reacting with a base polymer (e.g., a vinyl-containing resin such as a polyphenylene oxide/triallyl-isocyanurate (PPO/TAIC) composition). The NHC compound may be synthesized by, for example, reacting a halogenated imidazolium salt (e.g., 1,3-bis(4-bromo-2,6-dimethylphenyl)-4,5-dihydro-1H-imidazol-3-ium chloride) and an organostannane having a vinyl-containing moiety (e.g., tributyl(vinyl)stannane) in the presence of a palladium catalyst. In some embodiments, an enhanced substrate for a printed circuit board (PCB) is produced by laminating the carbene-coated metal foil to a substrate that includes glass fiber impregnated with the base polymer.

BRIEF DESCRIPTION OF THE SEVERAL VIEWS OF THE DRAWINGS

Embodiments of the present invention will hereinafter be described in conjunction with the appended drawings, where like designations denote like elements.

DETAILED DESCRIPTION

The basic concept behind a coupling agent is to join two disparate surfaces. In the case of printed circuit boards (PCBs), a silane coupling agent is often used to join a varnish coating (e.g., an epoxy-based resin) to a substrate (e.g., glass cloth) to define a laminate, or laminated structure. During the manufacture of PCBs, considerable attention is focused on the bond strength of the resin to the glass cloth. If the bond strength is insufficient, subsurface conductive anodic filament (CAF) growth may occur. CAF formation causes a number of reliability issues and can result in catastrophic failure of PCBs, which in some instances can cause fires. The silane coupling agent typically consists of an organofunctional group to bind to the varnish coating and a hydrolyzable group (typically, one or more alkoxy groups on a silicon atom) that binds to the surface of the substrate. In particular, the alkoxy groups on the silicon atom hydrolyze to silanols, either through the addition of water or from residual water on the surface of the substrate. Subsequently, the silanols react with hydroxyl groups on the surface of the substrate to form a siloxane bond (Si—O—Si) and eliminate water.

For the specific case of epoxy-based laminates, the organofunctional group that has been found to exhibit desirable performance based on numerous criteria is vinylbenzylaminoethylaminopropyl and also benzylaminoethylaminopropyl. Silane coupling agents, which include this organofunctional group, are thought to covalently bond to the epoxide functional groups of the traditional epoxy-based resin, such as the well known FR4 epoxy resins, through the secondary nitrogens of the amino groups. While a plethora of silane coupling agents exists, the industry workhorse for coupling epoxy-based resins has been vinylbenzylaminoethylaminopropyltrimethoxysilane (commercially available as Dow Corning Z-6032).

The PCB industry has recently migrated away from the traditional FR4 epoxy based resins (due to lead-free requirements and the higher soldering temperatures associated with tin-silver-copper alloys). Hence, current varnish coatings are typically no longer comprised of FR4 epoxies, rather they are more likely to be vinyl-containing resins such as triallylcyanurate, bismaleimide triazine (BT) resins or polyphenylene oxide/triallyl-isocyanurate (PPO/TAIC) interpenetrating networks. Typically, vinylbenzylaminoethylaminopropyltrimethoxysilane, originally developed for traditional FR4 epoxies, is still the coupling agent utilized to couple, or bond, the glass cloth substrate to the laminate varnish. However, other silane coupling agents, such as diallylpropylisocyanuratetrimethoxysilane, have been proposed for use in making high-temperature PCBs.

In the manufacture of PCBs, relatively less attention is focused on the adhesion of the resin to copper. Conventionally, adhesion of the resin to copper is accomplished by various conversion coatings (e.g., applying an oxide multi-layer bonder conversion coating to the copper surface) and/or mechanical roughening (e.g., copper dendrites may be grown on the rough side of electrodeposited (ED) copper foil).

The conventional electrodeposited copper manufacturing process, which electrolytically deposits copper from a copper electrolyte solution onto a rotating titanium drum, produces copper foil that has a rough side (also referred to as the "matte side") and a smooth side (also referred to as the "drum side"). The rough (matte) side of ED copper foil typically has a root-mean-square (RMS) surface roughness of $R_q > 0.3$ μm. On the other hand, the smooth (drum) side of ED copper foil typically has an RMS surface roughness of $R_q \leq 0.5$ μm.

Rolled copper foil, which is made by exposing a billet of pure copper to successive cold rolling operations, is typically the smoothest. Each side of rolled copper foil typically has an RMS surface roughness of $R_q \leq 0.4$ μm.

As signal speeds increase (i.e., as signal frequency increases), mechanical roughening of the copper foil is no longer an acceptable option to improve resin-to-copper adhesion because the signal integrity is degraded as the surface roughness increases. At high signal frequencies, the skin effect is more dominant. The "skin effect" refers to the phenomenon wherein electronic signals travel predominantly along the surface of a conductor as opposed to the bulk of the conductor. Consequently, it is necessary to enhance resin adhesion to copper surfaces that are very smooth (e.g., an RMS surface roughness of $R_q \leq 0.5$ µm).

In addition to conversion coatings and/or mechanical roughening, silane coupling agents are sometimes used to improve resin-to-copper adhesion. For example, the rough side of ED copper foil is typically coated with zinc-nickel or brass, and sometimes subsequently coated with a silane coupling agent, before the rough side of the ED copper foil is laminated to the resin. The silane coupling agent of such treated ED copper foil forms a strong bond with the resin. The use of silane coupling agents directly on copper, however, is predicated upon forming a strong bond to an oxidized copper surface. Oxidation of the copper surface, like mechanical roughening, degrades signal integrity. Therefore, it is necessary to enhance resin adhesion not only to very smooth copper surfaces, but also to clean (i.e., non-oxidized) copper surfaces.

In accordance with some embodiments of the present invention, a carbene-coated metal foil is produced by applying an N-heterocyclic carbene (NHC) compound to one or more surfaces of a metal foil (e.g., an electrodeposited copper foil having a surface that is smooth and non-oxidized). The NHC compound contains a matrix-reactive pendant group that includes at least one of a vinyl-, allyl-, acrylic-, methacrylic-, styrenic-, amine-, amide- and epoxy-containing moiety capable of reacting with a base polymer (e.g., a vinyl-containing resin such as a polyphenylene oxide/triallyl-isocyanurate (PPO/TAIC) composition). The NHC compound may be synthesized by, for example, reacting a halogenated imidazolium salt (e.g., 1,3-bis(4-bromo-2,6-dimethylphenyl)-4,5-dihydro-1H-imidazol-3-ium chloride) and an organostannane having a vinyl-containing moiety (e.g., tributyl(vinyl)stannane) in the presence of a palladium catalyst. In some embodiments, an enhanced substrate for a printed circuit board (PCB) is produced by laminating the carbene-coated metal foil to a substrate that includes glass fiber impregnated with the base polymer.

For purposes of this document, including the claims, the term "metal foil" refers to a thin flexible sheet of any suitable metal. Suitable metals include, but are not limited to, copper, gold, nickel, silver, tin, aluminum, platinum, titanium, zinc, chrome, and alloys thereof. Additionally, the metal foil may be a composite of two or more of the suitable metals (e.g., one surface is copper and the other surface is another of the suitable metals). Preferably, the metal foil is a copper foil (e.g., an ED copper foil or a rolled copper foil).

It is well known in the art that NHCs bond to late transition metals and gold surfaces. The sigma donating capability of NHCs make them excellent choices for bonding to smooth copper surfaces. By using the appropriate functional group pendant from the NHC, coupling of the smooth copper surface to the laminate resin can be achieved. The appropriate functional group can be selected from matrix-reactive pendant groups including, but not limited to, vinyl, allyl, acrylic, methacrylic, styrenic, etc. In accordance with some embodiments of the present invention, selection of the matrix-reactive pendant group can be tailored to enhance bonding to the base polymer of the laminate resin.

For example, if the base polymer comprises a vinyl-containing resin, then at least one of a vinyl-, allyl-, acrylic-, methacrylic-, and styrenic-containing moiety may be selected as the matrix-reactive pendant group. Selection of a vinyl-containing moiety as the matrix-reactive pendant group, for example, would allow the pendant vinyl group to be available for crosslinking into vinyl-containing laminate resins, such as MEGTRON6 (R-5775) (i.e., a PPO/TAIC composition) available from Panasonic Corporation, via a free radical mechanism operative in the lamination cycle. On the other hand, if the base polymer comprises an epoxy resin, then at least one of an amine-, amide- and epoxy-containing moiety may be selected as the matrix-reactive pendant group.

The NHC compound, in accordance with some embodiments of the present invention, can be unsaturated (imidazol-2-ylidine) or saturated (4,5-dihydro-imidazol-2-ylidene). Substituents on the NHC compound at the 1 and 3 positions, which may be the same or different from one another, generally have one to about twenty carbons atoms. Each of these substituents includes, independently, an alkyl moiety and/or an aryl moiety. A preferred aryl moiety is a phenyl group. Aryl group substituents are preferably substituted by one or more alkyl groups. In accordance with some embodiments of the present invention, at least one, and preferably both, of the substituents on the NHC compound at the 1 and 3 positions includes one or more matrix-reactive pendant groups.

Examples of suitable NHC compounds that can be used in accordance with some embodiments of the present invention include, but are not limited to, matrix-reactive pendant group substituted derivatives of: N,N'-dimethyl-imidazol-2-ylidene, N,N'-diethyl-4,5-dihydro-imidazol-2-ylidene, N,N'-di-n-propyl-imidazol-2-ylidene, N,N'-di(isopropyl)-4,5-dihydro-imidazol-2-ylidene, N,N'-di-tert-butyl-imidazol-2-ylidene, N,N'-di(2,2-dimethylpropyl)-4,5-dihydro-imidazol-2-ylidene, N,N'-dicyclopentyl-imidazol-2-ylidene, N,N'-di(cyclohexyl)-imidazol-2-ylidene, N,N'-di(cyclohexyl)-4,5-dihydro-imidazol-2-ylidene, N,N'-di(methylcyclohexyl)-4,5-dihydro-imidazol-2-ylidene, N,N'-di(adamantyl)-imidazol-2-ylidene, N,N'-dibenzyl-4,5-dihydro-imidazol-2-ylidene, N,N'-dinaphthyl-imidazol-2-ylidene, N,N'-ditolyl-4,5-dihydro-imidazol-2-ylidene, N,N'-bis[2,6-di(isopropyl)phenyl]-imidazol-2-ylidene, N,N'-bis[2,6-di(isopropyl)phenyl]-4,5-dihydro-imidazol-2-ylidene, N,N'-bis(2,4,6-trimethylphenyl)-imidazol-2-ylidene, N,N'-bis(2,4,6-trimethylphenyl)-4,5-dihydro-imidazol-2-ylidene, N,N'-bis[2,4,6-tri(isopropyl)phenyl]-imidazol-2-ylidene, N,N'-bis[2,6-di(tert-butyl)phenyl]-4,5-dihydro-imidazol-2-ylidene, N,N'-bis(triphenylmethyl)-imidazol-2-ylidene, N,N'-bis(1,3-dimethyl-2-naphthyl)-4,5-dihydro-imidazol-2-ylidene, and the like. Preferred NHC compounds include matrix-reactive pendant group substituted derivatives of: N,N'-di(cyclohexyl)-imidazol-2-ylidene, N,N'-di(adamantyl)-imidazol-2-ylidene, N,N'-bis[2,6-di(isopropyl)phenyl]-imidazol-2-ylidene, N,N'-bis(2,4,6-trimethylphenyl)-imidazol-2-ylidene, N,N'-bis[2,6-di(isopropyl)phenyl]-4,5-dihydro-imidazol-2-ylidene, and N,N'-bis(2,4,6-trimethylphenyl)-4,5-dihydro-imidazol-2-ylidene.

Suitable NHC compounds that can be used in accordance with some embodiments of the present invention include matrix-reactive pendant group substituted derivatives of both NHCs and NHC precursors. An NHC precursor is converted to an NHC via chemical and/or physical treatment (e.g., via exposure to a base and/or via exposure to heat). Once an NHC precursor is converted to an NHC, the carbene moiety (i.e., two unpaired electrons) of the NHC may form a bond (e.g., a covalent bond) with the metal film. Numerous NHCs and NHC precursors, as well as methods of synthesizing them, are disclosed in International Publication Number WO 2014/160471 A2, the entire contents of which are hereby incorporated herein by reference.

Figure 1:
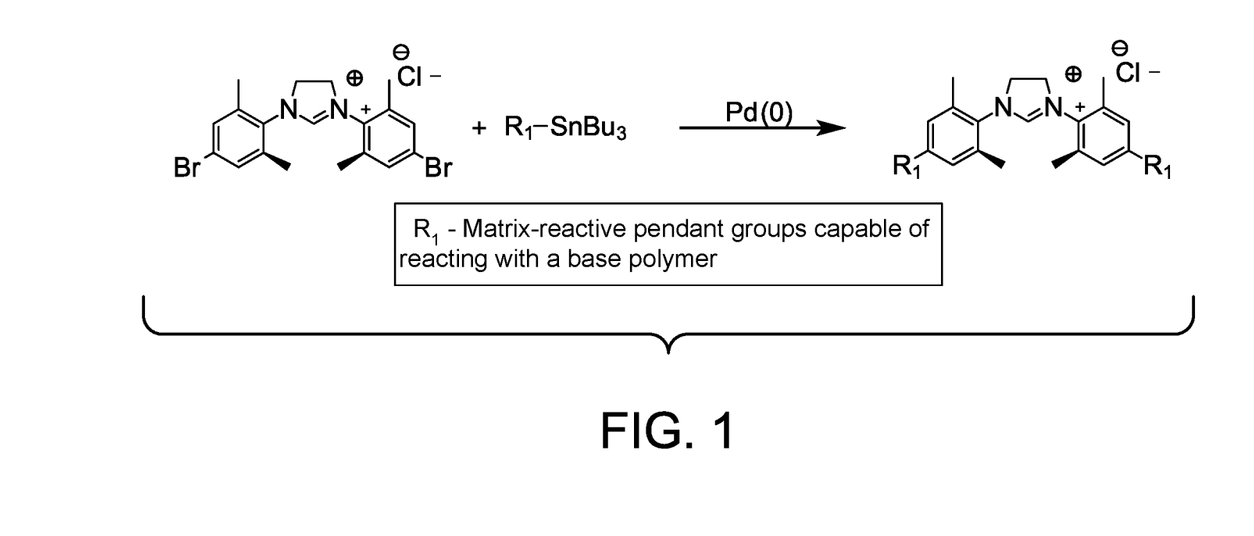
FIG. 1 is a chemical reaction diagram showing the synthesis of an N-heterocyclic carbene (NHC) compound containing organic functionalities to improve metal-to-resin adhesion in accordance with some embodiments of the present invention.

FIG. 1 is a chemical reaction diagram showing the synthesis of an N-heterocyclic carbene (NHC) compound containing organic functionalities to improve metal-to-resin adhesion in accordance with some embodiments of the present invention. In the synthetic procedure shown in FIG. 1, a brominated imidazolium salt (i.e., 1,3-bis(4-bromo-2,6-dimethylphenyl)-4,5-dihydro-1H-imidazol-3-ium chloride) and a matrix-reactive functionalized organostannane are reacted in the presence of a palladium catalyst in a Stille coupling to produce an NHC compound containing organic functionalities to improve metal-to-resin adhesion.

The 1,3-bis(4-bromo-2,6-dimethylphenyl)-4,5-dihydro-1H-imidazol-3-ium chloride used in the synthetic procedure shown in FIG. 1 may be synthesized, for example, via Reaction Scheme 1, described below. 1,3-bis(4-bromo-2,6-dimethylphenyl)-4,5-dihydro-1H-imidazol-3-ium chloride is an exemplary halogenated imidazolium salt. Any suitable halogenated imidazolium salt may be used in the synthetic procedure shown in FIG. 1 in lieu of, or in addition to, 1,3-bis(4-bromo-2,6-dimethylphenyl)-4,5-dihydro-1H-imidazol-3-ium chloride.

The matrix-reactive functionalized organostannane used in the synthetic procedure shown in FIG. 1 is represented by the following formula $R_1$—$SnBu_3$, wherein $R_1$ is a matrix-reactive pendant group that includes at least one moiety (e.g., a vinyl-, allyl-, acrylic-, methacrylic-, styrenic-, amine-, amide- or epoxy-containing moiety) capable of reacting with a base polymer. Any suitable matrix-reactive functionalized organostannane may be used in the synthetic procedure shown in FIG. 1. Suitable reactive-matrix functionalized organostannanes include organostannanes functionalized with a matrix-reactive group $R_1$ that includes at least one moiety (e.g., a vinyl-, allyl-, acrylic-, methacrylic-, styrenic-, amine-, amide- or epoxy-containing moiety) capable of reacting with a base polymer.

Suitable reactive-matrix functionalized organostannanes that include a vinyl-containing moiety include, but are not limited to, tributyl(vinyl)stannane (CAS No. 7486-35-3). Tributyl(vinyl)stannane is used in Reaction Scheme 2, described below. Suitable reactive-matrix functionalized organostannanes that include a vinyl-containing moiety may be obtained commercially or synthesized using synthetic procedures well known in the art.

Suitable reactive-matrix functionalized organostannanes that include an allyl-containing moiety include, but are not limited to, allyltributylstannane (CAS No. 24850-33-7). Allyltributylstannane is used in Reaction Scheme 3, described below. Suitable reactive-matrix functionalized organostannanes that include an allyl-containing moiety may be obtained commercially or synthesized using synthetic procedures well known in the art.

Suitable reactive-matrix functionalized organostannanes that include an acrylic-containing moiety include, but are not limited to, tributyltin acrylate (CAS No. 13331-52-7). Tributyltin acrylate is used in Reaction Scheme 4, described below. Suitable reactive-matrix functionalized organostannanes that include an acrylic-containing moiety may be obtained commercially or synthesized using synthetic procedures well known in the art.

Suitable reactive-matrix functionalized organostannanes that include a methacrylic-containing moiety include, but are not limited to, tributyltin methacrylate (CAS No. 2155-70-6). Tributyltin methacrylate is used in Reaction Scheme 5, described below. Suitable reactive-matrix functionalized organostannanes that include a methacrylic-containing moiety may be obtained commercially or synthesized using synthetic procedures well known in the art.

Suitable reactive-matrix functionalized organostannanes that include a styrenic-containing moiety include, but are not limited to, (z)-tributyl(4-vinylstyryl)stannane. (Z)-tributyl (4-vinylstyryl)stannane is used in Reaction Scheme 6, described below. Suitable reactive-matrix functionalized organostannanes that include a styrenic-containing moiety may be obtained commercially or synthesized using synthetic procedures well known in the art.

Suitable reactive-matrix functionalized organostannanes that include an amine-containing moiety may be obtained commercially or synthesized using synthetic procedures well known in the art.

Suitable reactive-matrix functionalized organostannanes that include an amide-containing moiety may be obtained commercially or synthesized using synthetic procedures well known in the art.

Suitable reactive-matrix functionalized organostannanes that include an epoxy-containing moiety may be obtained commercially or synthesized using synthetic procedures well known in the art.

The 1,3-bis(4-bromo-2,6-dimethylphenyl)-4,5-dihydro-1H-imidazol-3-ium chloride used in the synthetic procedure shown in FIG. 1 may be synthesized, for example, via Reaction Scheme 1 as follows:

Reaction Scheme 1

Reaction Scheme 1, which is disclosed in International Publication Number WO 2014/160471 A2, involves two steps. These steps are performed according to the general procedure of Kuhn et al., "A Facile Preparation of Imidazolinium Chlorides", Organic Letters, 2008, Vol. 10, No. 10, pp. 2075-2077, the entire contents of which are hereby incorporated herein by reference.

In the first step of Reaction Scheme 1, N,N'-bis(4-bromo-2,6-dimethylphenyl)formimidamide is prepared. A round bottom flask is charged with 4-bromo-2,6-dimethylaniline (12 g, 60 mmol, 2 equiv) and triethyl orthoformate (5 mL, 30 mmol, 1 equiv). Acetic acid (86 µL, 1.5 mmol) is then added to the flask. The flask is then fitted with a distillation head and heated at 140° C. stirring for 12 hours. The solution solidifies to a crude reaction product upon cooling to room temperature. The crude reaction product is triturated using cold hexanes (30 mL), collected by vacuum filtration, and dried in vacuo.

In the second step of Reaction Scheme 1, 1,3-bis(4-bromo-2,6-dimethylphenyl)-4,5-dihydro-1H-imidazol-3-ium chloride is prepared. A Schlenk tube is charged with a solution of N,N'-bis(4-bromo-2,6-dimethylphenyl)formimidamide (2.1 g, 5 mmol, 1 equiv) prepared in the first step of Reaction Scheme 1 and dichloroethane (DCE) (3.8 mL, 50 mmol, 10 equiv), and the solution is stirred. Diisopropylethylamine (DIPA) (0.96 mL, 5.5 mmol, 1.1 equiv) is then added to the stirred solution. The Schlenk tube is evacuated until the solvent begins to bubble, then sealed under static vacuum and heated to 120° C. for 72 hours. The reaction mixture is then cooled to room temperature, and excess dichloroethane is removed in vacuo. The residue is triturated using acetone or hot toluene, collected by vacuum filtration, washed with excess solvent, and dried in vacuo.

In a first example, a halogenated imidazolium salt (i.e., the 1,3-bis(4-bromo-2,6-dimethylphenyl)-4,5-dihydro-1H-imidazol-3-ium chloride synthesized via Reaction Scheme 1) is reacted with tributyl(vinyl)stannane via palladium-catalyzed Stille coupling to form a vinyl-functionalized NHC compound as shown in Reaction Scheme 2 as follows:

Reaction Scheme 2

The vinyl-functionalized NHC compound produced via Reaction Scheme 2, above, contains vinyl functionalities that can react with a base polymer. Selection of a vinyl-containing moiety as the matrix-reactive pendant group allows the pendant vinyl group to be available for crosslinking into vinyl-containing laminate resins, for example, via a free radical mechanism operative in the lamination cycle.

Prophetic Example of RS2

Some of the 1,3-bis(4-bromo-2,6-dimethylphenyl)-4,5-dihydro-1H-imidazol-3-ium chloride synthesized via Reaction Scheme 1 (946 mg, 2.00 mmol), tris(dibenzylideneacetone)dipalladium(0) (110 mg, 0.12 mmol) and tri(2-furyl)phosphine (74 mg, 0.32 mmol) are added into a vial with a stir bar. The vial containing the mixture is brought into an $N_2$-filled glovebox. Tributyl(vinyl)stannane (1.22 mL, 4.20 mmol) and acetonitrile (2.00 mL) are then added to the vial. (Before being added to the vial, the tributyl(vinyl)stannane is deoxygenated using known techniques such as successive cycles of freeze-pump-thaw.) The vial is then sealed and removed from the glovebox. The vial is heated at 80° C. for 4.5 hours with stirring. The reaction product may be purified using techniques well known in the art. *End of Prophetic Example of RS2*

In a second example, a halogenated imidazolium salt (i.e., the 1,3-bis(4-bromo-2,6-dimethylphenyl)-4,5-dihydro-1H-imidazol-3-ium chloride synthesized via Reaction Scheme 1) is reacted with allyltributylstannane via palladium-catalyzed Stille coupling to form a bis-β-methylstyrene derivative NHC compound as shown in Reaction Scheme 3 as follows:

Reaction Scheme 3

Reaction Scheme 3, which is disclosed in International Publication Number WO 2014/160471 A2, produces the bis-β-methylstyrene derivative, rather than the bis-allyl, as the result of [NHC—Pd—H]$^+$-catalyzed allyl isomerization. The bis-β-methylstyrene derivative NHC compound produced via Reaction Scheme 3, above, contains bis-β-methylstyrene functionalities that are much less reactive (compared to allyl functionalities) with a base polymer. Selection of an allyl-containing moiety, on the other hand, as the matrix-reactive pendant group allows the pendant allyl group to be available for crosslinking into vinyl-containing laminate resins, for example, via a free radical mechanism operative in the lamination cycle.

Prophetic Example of RS3

Some of the 1,3-bis(4-bromo-2,6-dimethylphenyl)-4,5-dihydro-1H-imidazol-3-ium chloride synthesized via Reaction Scheme 1 (946 mg, 2.00 mmol), tris(dibenzylideneacetone)dipalladium(0) (110 mg, 0.12 mmol) and tri-tert-butylphosphonium tetrafluoroborate (76 mg, 0.13 mmol) are added into a vial with a stir bar. The vial containing the mixture is brought into an $N_2$-filled glovebox. To the vial are added first cesium fluoride (1.28 g, 8.4 mmol), then allyltributylstannane (1.30 mL, 4.20 mmol), and then N-methyl-2-pyrrolidone (2.0 mL). (Before being added to the vial, the allyltributylstannane is deoxygenated using known techniques such as successive cycles of freeze-pump-thaw.) The vial is then sealed and removed from the glovebox. The vial is heated at 100° C. for 4.5 hours with stirring. The reaction product may be purified using techniques well known in the art. *End of Prophetic Example of RS3*

In a third example, a halogenated imidazolium salt (i.e., the 1,3-bis(4-bromo-2,6-dimethylphenyl)-4,5-dihydro-1H-imidazol-3-ium chloride synthesized via Reaction Scheme 1) is reacted with tributyltin acrylate via palladium-catalyzed Stille coupling to form an acrylate-functionalized NHC compound as shown in Reaction Scheme 4 as follows:

Reaction Scheme 4

The acrylate-functionalized NHC compound produced via Reaction Scheme 4, above, contains acrylate functionalities that can react with a base polymer. Selection of an acrylate-containing moiety as the matrix-reactive pendant group allows the pendant acrylate group to be available for crosslinking into vinyl-containing laminate resins, for example, via a free radical mechanism operative in the lamination cycle.

Prophetic Example of RS4

Some of the 1,3-bis(4-bromo-2,6-dimethylphenyl)-4,5-dihydro-1H-imidazol-3-ium chloride synthesized via Reaction Scheme 1 (946 mg, 2.00 mmol), tris(dibenzylideneacetone)dipalladium(0) (110 mg, 0.12 mmol) and tri(2-furyl)phosphine (74 mg, 0.32 mmol) are added into a vial with a stir bar. The vial containing the mixture is brought into an $N_2$-filled glovebox. Tributyltin acrylate (1.51 g, 4.20 mmol) and acetonitrile (2.00 mL) are then added to the vial. (Before being added to the vial, the tributyltin acrylate is deoxygenated using known techniques such as successive cycles of freeze-pump-thaw.) The vial is then sealed and removed from the glovebox. The vial is heated at 80° C. for 4.5 hours with stirring. The reaction product may be purified using techniques well known in the art. *End of Prophetic Example of RS4*

In a fourth example, a halogenated imidazolium salt (i.e., the 1,3-bis(4-bromo-2,6-dimethylphenyl)-4,5-dihydro-1H-imidazol-3-ium chloride synthesized via Reaction Scheme 1) is reacted with tributyltin methacrylate via palladium-catalyzed Stille coupling to form a methacrylate-functionalized NHC compound as shown in Reaction Scheme 5 as follows:

Reaction Scheme 5

The methacrylate-functionalized NHC compound produced via Reaction Scheme 4, above, contains methacrylate functionalities that can react with a base polymer. Selection of a methacrylate-containing moiety as the matrix-reactive pendant group allows the pendant methacrylate group to be available for crosslinking into vinyl-containing laminate resins, for example, via a free radical mechanism operative in the lamination cycle.

Prophetic Example of RS5

Some of the 1,3-bis(4-bromo-2,6-dimethylphenyl)-4,5-dihydro-1H-imidazol-3-ium chloride synthesized via Reaction Scheme 1 (946 mg, 2.00 mmol), tris(dibenzylideneacetone)dipalladium(0) (110 mg, 0.12 mmol) and tri(2-furyl)phosphine (74 mg, 0.32 mmol) are added into a vial with a stir bar. The vial containing the mixture is brought into an $N_2$-filled glovebox. Tributyltin methacrylate (1.01 mL, 4.20 mmol) and acetonitrile (2.0 mL) are then added to the vial. (Before being added to the vial, the tributyltin methacrylate is deoxygenated using known techniques such as successive cycles of freeze-pump-thaw.) The vial is then sealed and removed from the glovebox. The vial is heated at 80° C. for 4.5 hours with stirring. The reaction product may be purified using techniques well known in the art. *End of Prophetic Example of RS5*

In a fifth example, a halogenated imidazolium salt (i.e., the 1,3-bis(4-bromo-2,6-dimethylphenyl)-4,5-dihydro-1H-imidazol-3-ium chloride synthesized via Reaction Scheme 1) is reacted with (z)-tributyl(4-vinylstyryl)stannane via palladium-catalyzed Stille coupling to form a styrene-functionalized NHC compound as shown in Reaction Scheme 6 as follows:

Reaction Scheme 6

The styrene-functionalized NHC compound produced via Reaction Scheme 6, above, contains styrene functionalities that can react with a base polymer. Selection of a styrene-containing moiety as the matrix-reactive pendant group allows the pendant styrene group to be available for cross-linking into vinyl-containing laminate resins, for example, via a free radical mechanism operative in the lamination cycle.

Prophetic Example of RS6

Some of the 1,3-bis(4-bromo-2,6-dimethylphenyl)-4,5-dihydro-1H-imidazol-3-ium chloride synthesized via Reaction Scheme 1 (946 mg, 2.00 mmol), tris(dibenzylideneacetone)dipalladium(0) (110 mg, 0.12 mmol) and tri(2-furyl)phosphine (74 mg, 0.32 mmol) are added into a vial with a stir bar. The vial containing the mixture is brought into an $N_2$-filled glovebox. (Z)-tributyl(4-vinylstyryl)stannane (1.76 g, 4.20 mmol) and acetonitrile (2.00 mL) are then added to the vial. (Before being added to the vial, the (z)-tributyl(4-vinylstyryl)stannane is deoxygenated using known techniques such as successive cycles of freeze-pump-thaw.) The vial is then sealed and removed from the glovebox. The vial is heated at 80° C. for 4.5 hours with stirring. The reaction product may be purified using techniques well known in the art. *End of Prophetic Example of RS6*

The NHC compounds produced via Reaction Schemes 2-6, above, are NHC precursors. These NHC precursors, in accordance with some embodiments of the present invention, are subsequently converted to corresponding NHCs via chemical and/or physical treatment (e.g., via exposure to a base and/or via exposure to a heat). Once NHC precursors produced via Reaction Schemes 2-6 are converted to corresponding NHCs, the carbene moiety (i.e., two unpaired electrons) of each corresponding NHC may form a covalent bond with the metal film.

The (z)-tributyl(4-vinylstyryl)stannane used as the organostannane reagent in Reaction Scheme 6 may be synthesized, for example, via Reaction Scheme 7 as follows:

Reaction Scheme 7

In Reaction Scheme 7, (z)-tributyl(4-vinylstyryl)stannane is synthesized by reacting 1,4-divinylbenzene and tributyltin chloride in the presence of n-butyllithium (n-BuLi).

Prophetic Example of RS7

Under a nitrogen atmosphere, a THF (20 ml) solution of 1,4-divinylbenzene (0.55 mL, 3.87 mmol) is cooled down to −78° C., and 1.6M n-BuLi (2.50 ml, 4.08 mmol) is slowly added into a vial with a magnetic stir bar. The resulting solution is then increased in temperature to a room temperature, stirred for 1 hour, and cooled again down to −78° C. Tributyltin chloride (0.55 ml, 2.04 mmol) is then added to the solution and then stirred for 2 hours. Then, water (80 ml) is added to the resulting solution. The reaction product may be purified using techniques well known in the art. *End of Prophetic Example of RS7*

Figure 2:
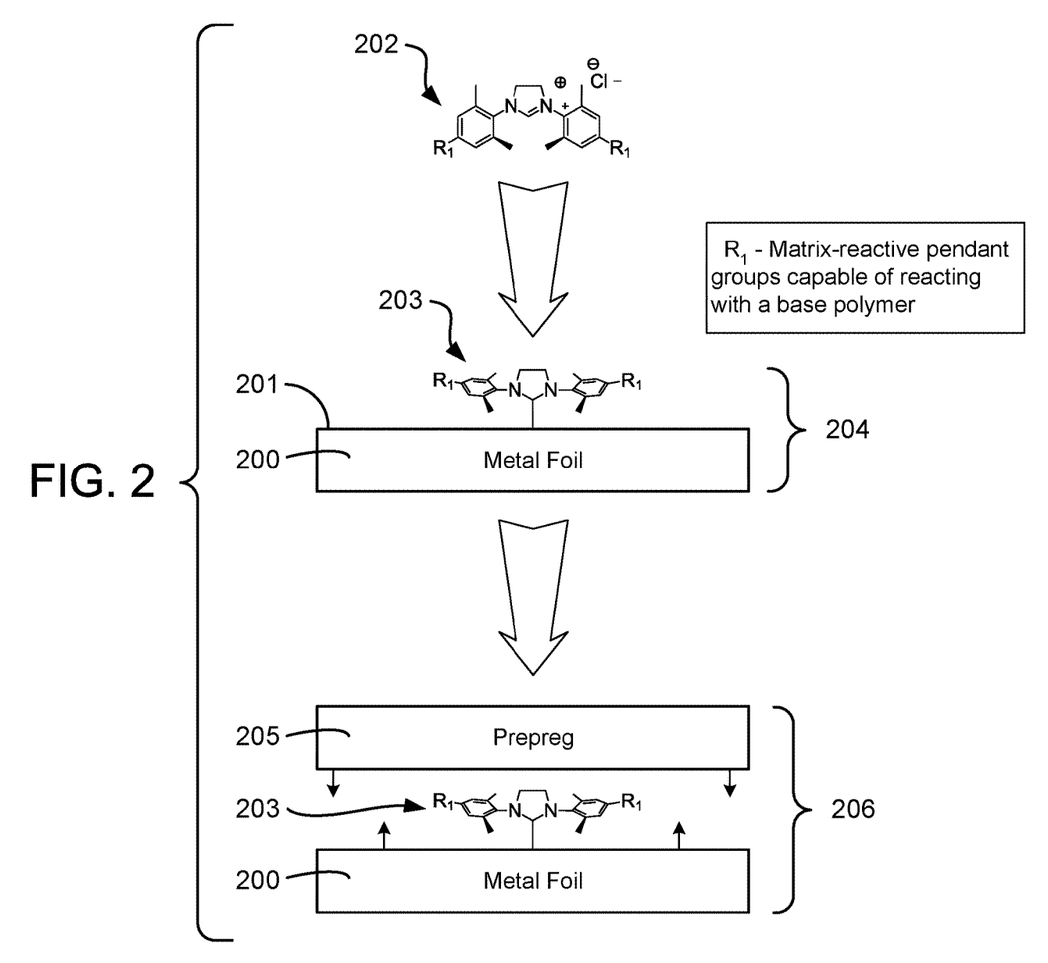
FIG. 2 is a block diagram showing a metal foil having its surface modified by an N-heterocyclic carbene (NHC) compound containing organic functionalities to improve metal-to-resin adhesion in accordance with some embodiments of the present invention.

FIG. 2 is a block diagram showing a metal foil 200 having its surface 201 modified by an N-heterocyclic carbene (NHC) compound 202 containing organic functionalities to improve metal-to-resin adhesion in accordance with some embodiments of the present invention. The NHC compound 202 forms a carbene film 203 that is bonded to the surface 201 of the metal foil 200 to produce a carbene-coated metal foil 204. In the NHC compound 202 and the carbene film 203 shown in FIG. 2, $R_1$ represents the matrix-reactive pendant groups each of which includes at least one moiety (e.g., a vinyl-, allyl-, acrylic-, methacrylic-, styrenic-, amine-, amide- or epoxy-containing moiety) capable of reacting with a base polymer. Once the carbine-coated metal foil 204 is produced, it may be incorporated into conventional laminate processing techniques.

The metal foil 200 may be, for example, conventional electrodeposited (ED) copper foil prepared using any suitable industry standard processes. In accordance with some embodiments of the present invention, the ED copper foil 200 may be fed into a bath containing the NHC compound 202 dissolved in suitable solvent. For example, the ED copper foil 200 may be immersed at a predetermined feed speed into a solution of the NHC compound 202 dissolved in anhydrous tetrahydrofuran (THF) and containing 1.0M potassium hexamethyldisilazide (KHMDS) (in THF), which converts the imidazolium salt to the carbene moiety. The concentration of the NHC compound 202 in the solution may be, for example, 40 mM. The solution may be at ambient temperature or at some other suitable temperature. The feed speed of the ED copper foil 200 through the bath may be adjusted to alter the thickness of the carbene film 203. A monolayer is sufficient. The feed speed required to achieve monolayer coverage may be determined empirically. Optionally, the carbene-coated ED copper foil 204 may be washed with one or more organic solvents (e.g., THF, dichloromethane, methanol, hexane, and the like). The carbene-coated ED copper foil 204 is subsequently dried by any suitable technique known to those skilled in the art. For example, the carbene-coated ED copper foil 204 may be dried via heating for a suitable period of time (e.g., 60 minutes at 70° C.).

Once the carbine-coated ED copper foil 204 is produced, it may be incorporated into conventional laminate processing techniques. For example, the carbine-coated ED copper foil 204 may be laminated to a prepreg 205 comprising a sheet of woven glass fiber (not shown) impregnated with a base polymer that comprises, for example, either a vinyl-containing resin or an epoxy-containing resin, to produce an enhanced substrate 206 for a PCB. The lamination and cure may be performed in a laminating press, for example, using a suitable pressure (e.g., 700 psi) and a suitable heating cycle (e.g., dynamically heating at from 40° C. to 190° C. for 25 minutes and, then, isothermally heating at 190° C. for 3 hours).

One skilled in the art will appreciate that many variations are possible within the scope of the present invention. Thus, while the present invention has been particularly shown and described with reference to preferred embodiments thereof, it will be understood by those skilled in the art that these and other changes in form and details may be made therein without departing from the spirit and scope of the present invention.

What is claimed is:

1. An enhanced substrate comprising:
a substrate, wherein the substrate comprises glass fiber impregnated with a base polymer;
a carbene-coated metal foil laminated to the substrate, wherein the carbene-coated metal foil comprises a conductive surface treated with an N-heterocyclic carbene (NHC) compound comprising a matrix-reactive pendant group, wherein the matrix-reactive pendant group of the NHC compound enhances bonding of the carbene-coated metal foil to the base polymer, and wherein the NHC compound is a NHC precursor represented by the following formula:

2. The enhanced substrate as recited in claim 1, wherein the carbene-coated metal foil comprises an electrodeposited copper foil having a copper surface treated with the NHC compound.

3. The enhanced substrate as recited in claim 2, wherein the copper surface of the electrodeposited copper foil is smooth, with a root-mean-square (RMS) surface roughness of $R_q \leq 0.5$ μm, and non-oxidized.

4. The enhanced substrate as recited in claim 2, wherein the substrate is a prepreg comprising a sheet of woven glass fiber impregnated with the base polymer.

5. The enhanced substrate as recited in claim 2, wherein the base polymer comprises a vinyl-containing resin, and wherein the matrix-reactive pendant group of the NHC compound enhances bonding of the carbene-coated metal foil to the base polymer by crosslinking into the vinyl-containing resin of the base polymer.

6. An enhanced substrate comprising:
a substrate, wherein the substrate comprises glass fiber impregnated with a base polymer;
a carbene-coated metal foil laminated to the substrate, wherein the carbene-coated metal foil comprises a conductive surface treated with an N-heterocyclic carbene (NHC) compound comprising a matrix-reactive pendant group, wherein the matrix-reactive pendant group of the NHC compound enhances bonding of the carbene-coated metal foil to the base polymer, and wherein the NHC compound is a NHC precursor represented by one of the following formulas:

7. The enhanced substrate as recited in claim 6, wherein the carbene-coated metal foil comprises an electrodeposited copper foil having a copper surface treated with the NHC compound.

8. The enhanced substrate as recited in claim 7, wherein the copper surface of the electrodeposited copper foil is smooth and non-oxidized.

9. The enhanced substrate as recited in claim 7, wherein the substrate is a prepreg comprising a sheet of woven glass fiber impregnated with the base polymer.

10. The enhanced substrate as recited in claim 7, wherein the base polymer comprises a vinyl-containing resin, and wherein the matrix-reactive pendant group of the NHC compound enhances bonding of the carbene-coated metal foil to the base polymer by crosslinking into the vinyl-containing resin of the base polymer.

11. An enhanced substrate comprising:
a substrate, wherein the substrate comprises is a prepreg comprising a sheet of woven glass fiber impregnated with a base polymer;
a carbene-coated metal foil laminated to the substrate, wherein the carbene-coated metal foil comprises an electrodeposited copper foil having a smooth and non-oxidized copper surface treated with an N-heterocyclic carbene (NHC) compound comprising a matrix-reactive pendant group, wherein the matrix-reactive pendant group of the NHC compound enhances bonding of the carbene-coated metal foil to the base polymer, and wherein the NHC compound is a NHC precursor represented by the following formula:

12. The enhanced substrate as recited in claim 11, wherein the base polymer comprises a vinyl-containing resin, and wherein the matrix-reactive pendant group of the NHC compound enhances bonding of the carbene-coated metal foil to the base polymer by crosslinking into the vinyl-containing resin of the base polymer.

13. The enhanced substrate as recited in claim 11, wherein the copper surface of the electrodeposited copper foil has a root-mean-square (RMS) surface roughness of $R_q \leq 0.5$ μm.

* * * * *